US012721180B2

(12) United States Patent
Wei

(10) Patent No.: US 12,721,180 B2
(45) Date of Patent: Aug. 25, 2026

(54) TECHNIQUES FOR PROTECTING INTEGRATED CIRCUITRY FROM PLASMA-INDUCED ELECTROSTATIC DISCHARGE USING A CARRIER SUBSTRATE WITH JUNCTION FEATURES

(71) Applicant: Intel Corporation, Santa Clara, CA (US)

(72) Inventor: Andy Chih-Hung Wei, Yamhill, OR (US)

(73) Assignee: INTEL CORPORATION, Santa Clara, CA (US)

( * ) Notice: Subject to any disclaimer, the term of this patent is extended or adjusted under 35 U.S.C. 154(b) by 231 days.

(21) Appl. No.: 17/411,156

(22) Filed: Aug. 25, 2021

(65) Prior Publication Data

US 2023/0069107 A1 Mar. 2, 2023

(51) Int. Cl.
*H10W 42/60* (2026.01)
*H05K 1/02* (2006.01)
*H10D 89/60* (2025.01)

(52) U.S. Cl.
CPC .......... *H10W 42/60* (2026.01); *H05K 1/0259* (2013.01); *H10D 89/60* (2025.01)

(58) Field of Classification Search
CPC ................. H01L 23/60; H01L 27/0248; H01L 21/76898; H01L 27/0688; H01L 27/0292;
(Continued)

(56) References Cited

U.S. PATENT DOCUMENTS

2014/0302660 A1 10/2014 Liu et al.
2016/0099182 A1* 4/2016 Lee .................... H10D 84/0191 438/109

(Continued)

FOREIGN PATENT DOCUMENTS

CN 113178433 A 7/2021
TW 201530662 A 8/2015

OTHER PUBLICATIONS

Extended European Search Report received for EP Application No. 22183721.4 dated Jan. 11, 2023. 7 pages.

*Primary Examiner* — Marlon T Fletcher
*Assistant Examiner* — Samuel Jonathan Smith
(74) *Attorney, Agent, or Firm* — Arcane Law PLLC

(57) ABSTRACT

Techniques are provided for protecting integrated circuits from plasma-induced electrostatic discharge (ESD) using a carrier substrate with integrated junctions. According to some embodiments, the various metal features within an interconnect region above a plurality of semiconductor devices are electrically coupled to one or more conductive pads on a bonded carrier substrate. The conductive pads provide a contact to underlying doped regions within the carrier substrate that form one or more PN junctions. This provides the ability to electrically ground metal features in the interconnect region via the carrier substrate. Formation of additional interconnect layers such as those provided during far back end of line (FBEOL) processing, can proceed while causing less plasma-induced ESD damage to the integrated circuit, because the interconnect region is connected to ground of carrier substrate by way of PN junctions, thus providing a discharge path for charge that develops during subsequent processing.

20 Claims, 14 Drawing Sheets

(58) Field of Classification Search
CPC ............. H01L 23/5226; H01L 23/5283; H01L 23/5286; H01L 27/0266; H05K 1/0259; H10W 42/60; H10W 20/427; H10D 89/60; H10D 89/921; H10D 89/611; H10D 89/711; H10D 89/811
See application file for complete search history.

(56) References Cited

U.S. PATENT DOCUMENTS

| | | | | |
|---|---|---|---|---|
| 2017/0213821 | A1 | 7/2017 | Or-Bach et al. | |
| 2019/0067217 | A1 | 2/2019 | England et al. | |
| 2021/0366846 | A1* | 11/2021 | Hung | H01L 27/0251 |
| 2022/0165721 | A1* | 5/2022 | Lee | H01L 24/16 |
| 2022/0368004 | A1 | 11/2022 | Huang et al. | |

* cited by examiner

TECHNIQUES FOR PROTECTING INTEGRATED CIRCUITRY FROM PLASMA-INDUCED ELECTROSTATIC DISCHARGE USING A CARRIER SUBSTRATE WITH JUNCTION FEATURES

FIELD OF THE DISCLOSURE

The present disclosure relates to integrated circuits, and more particularly, to techniques for protecting an integrated circuit from damage caused by plasma-induced electrostatic discharge (ESD).

BACKGROUND

As integrated circuits continue to scale downward in size, a number of challenges arise. For instance, reducing the size of memory and logic cells is becoming increasingly more difficult. One possible solution that can be used to allow further scaling of cell size includes buried or backside power rail technology, or more generally BPR technology. In some cases, BPR technology includes burying of conductors that deliver power (sometimes called power rails) to cells below the back end of line (BEOL) interconnect layers, usually in the same level as the device layer that includes semiconductor fins. In other cases, BPR technology includes forming such power rails on the backside of the substrate underneath the device layer. Such BPR configurations free-up overhead to make more room for logic connections and enable further scaling of a standard logic cell (e.g., memory and logic cells). BPR configurations also allow for relatively larger power rails (e.g., thicker), which in turn exhibit lower resistance and power dissipation. However, there remain a number of non-trivial challenges with respect to forming such BPR configurations.

Figure 1:
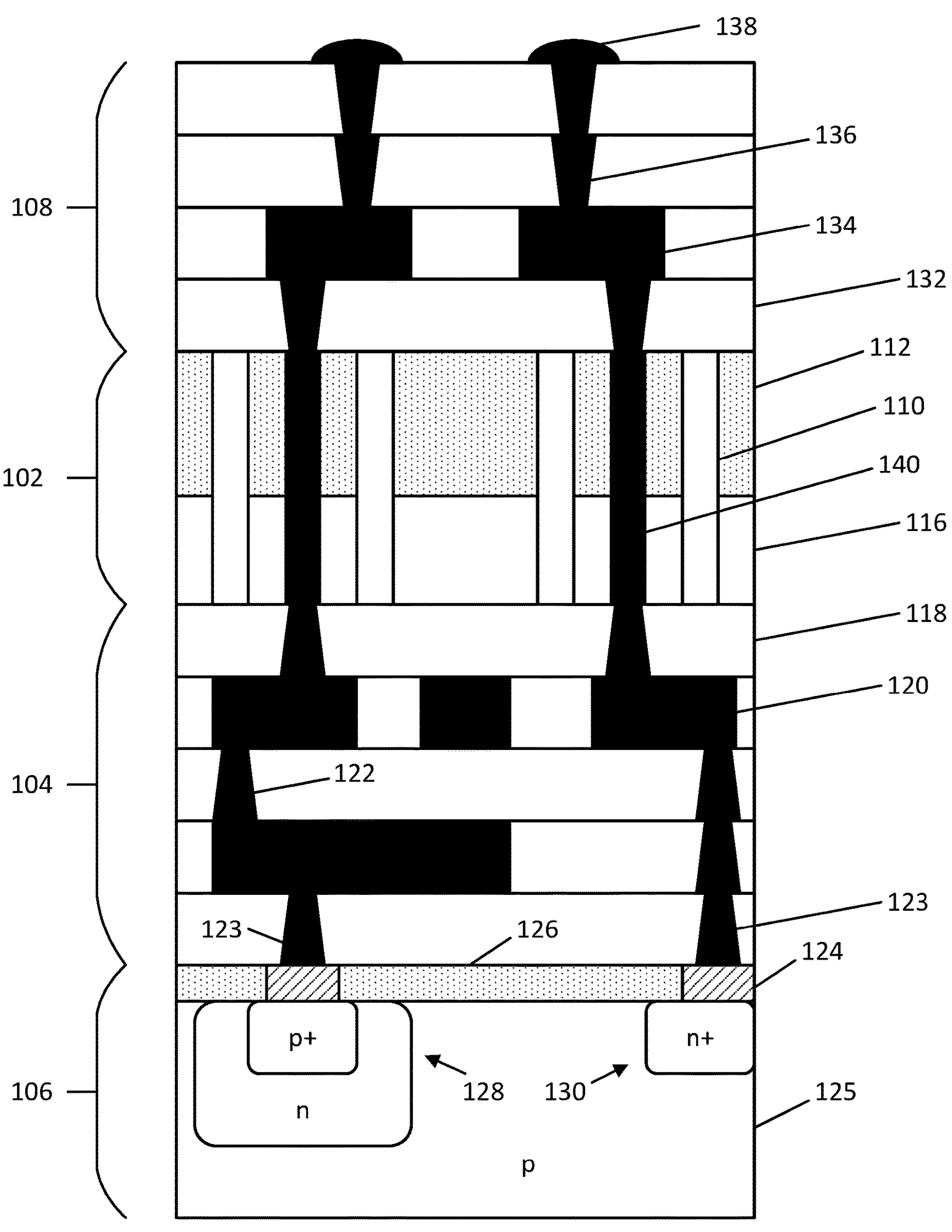
FIG. 1 is a cross-sectional view that illustrates an example portion of an integrated circuit configured with a carrier wafer having one or more integrated junctions, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein for protecting integrated circuits from electrostatic discharge (ESD) using a carrier substrate with integrated junctions. Although the techniques can be used in any number of integrated circuit applications, they are particularly useful with respect to contacting schemes for logic and memory cells, such as those cells that use finFETs, gate-all-around transistors, or other transistor technologies. According to some embodiments, the various metal features within an interconnect region above a plurality of semiconductor devices are electrically coupled to one or more conductive pads on a bonded carrier substrate. The conductive pads provide an ohmic contact to underlying doped regions within the carrier substrate that form one or more PN junctions in the carrier substrate, according to an embodiment. This provides the ability to electrically ground metal lines or other such metal features in the interconnect region via the carrier substrate. Formation of additional interconnect layers and conductive structures (e.g., BPR structures) provided during far back end of line (FBEOL) processing can proceed while causing less plasma-induced ESD damage to the integrated circuit. This is because the otherwise floating interconnect region is connected to the ground of the carrier substrate by way of the PN junctions, thus providing a discharge path for any charge that may develop during FBEOL or other such processing. Numerous variations and embodiments will be apparent in light of this disclosure.

GENERAL OVERVIEW

As previously noted above, there remain a number of non-trivial challenges with respect to BPR configurations. In more detail, scaling of standard memory and logic cells can be achieved by forming a power rail on a lower level, such as a buried power rail or a backside power rail. Such BPR configurations call for backside processing (under the device layer), to implement connections of a given backside power delivery scheme. Performing backside processing beneath the semiconductor devices may include the use of a flip-and-bond technique, where the original substrate, including a semiconductor device layer along with any middle-of-line (MOL) and back-end-of-line (BEOL) interconnect layers formed above that device layer, is flipped and bonded to a carrier substrate via a top one of the interconnect layers.

Then, a bulk portion of the original substrate on which the device layer was formed can be removed, so as to provide backside access to that device layer as well as any BPR features (if present). Such substrate removal, however, can cause the various features of the interconnect layers and/or device layer to be electrically floating during subsequent RF processing used to etch or form features during backside processing. In particular, plasma etching tends to induce charge in the various floating features of the device and interconnect layers, and with the original substrate removed, there is no path to dissipate any accumulated charge. To this end, the floating features are highly susceptible to plasma-induced electrostatic discharge (ESD), which can degrade the performance of, or even destroy, the semiconductor devices.

Thus, and in accordance with an embodiment of the present disclosure, techniques are provided herein to fabricate a carrier substrate that includes integrated junction regions along with conductive surface contacts that can be used to provide a discharge pathway to ground for plasma-induced charge that arises during backside processing, thereby reducing the risk of ESD damage to the conductive features from the interconnect region and device region of the integrated circuit. The doped junction regions of the carrier substrate can provide both diode regions and other ESD protection devices such as bipolar junction transistors (BJTs), to name two examples, that can be coupled to conductive vias within the interconnect region originally formed above the semiconductor devices. Additionally, each of the conductive layers within the interconnect region may be electrically coupled to one or more conductive vias at the top-most layer of the interconnect region. As will be appreciated, these conductive vias at the top-most interconnect layer can then be coupled to corresponding conductive pads on the carrier substrate which is bonded to the interconnect region. The bonded carrier substrate with the integrated junction regions allows for further backside processing operations to be performed while reducing plasma-induced ESD damage to the integrated circuit.

According to an embodiment, an integrated circuit includes a plurality of semiconductor devices, an interconnect region above the plurality of semiconductor devices and having a plurality of stacked interconnect layers, one or more metal features in any of the plurality of stacked interconnect layers, one or more conductive vias through one or more layers of the interconnect region and coupled to any of the one or more metal features, and a carrier substrate. The carrier substrate includes a semiconductor material with one or more doped junctions and one or more conductive pads on corresponding ones of the one or more doped junctions. The carrier substrate is bonded to the interconnect region such that the one or more conductive pads are in contact with corresponding ones of the one or more conductive vias.

According to another embodiment, a method of forming an integrated circuit includes forming a plurality of semiconductor devices on a first substrate; forming an interconnect region above the first plurality of semiconductor devices, the interconnect region comprising a plurality of stacked interconnect layers; forming one or more conductive vias through one or more layers of the interconnect region, the one or more conductive vias being in contact with one or more metal features in the interconnect region; forming one or more doped junctions in a second substrate; forming one or more conductive pads on corresponding ones of the one or more doped junctions; and bonding the second substrate onto the interconnect region such that the one or more conductive pads are in contact with corresponding ones of the one or more conductive vias.

The techniques can be used with any type of planar and non-planar transistors, including finFETs (sometimes called double-gate transistors, or tri-gate transistors), nanowire and nanoribbon transistors (sometimes called gate-all-around transistors), and thin film transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors to which power is being supplied by a buried or backside power rail, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of various doped regions within a carrier substrate bonded to the interconnect region of the integrated circuit. In some embodiments, the doped regions will include a conductive contact to one or more conductive vias present within the interconnect region. In some other example embodiments, such tools may indicate the presence of a thin semiconductor substate having one or more doped junctions beneath the semiconductor devices and between the semiconductor devices and a backside region having one or more stacked interconnect layers which may be formed with materials and processes similar to the interconnect region. Numerous configurations and variations will be apparent in light of this disclosure.

As used herein, the term “backside” generally refers to the area beneath one or more semiconductor devices (below the device layer) either within the device substrate or in the region of the device substrate (in the case where the bulk of the device substrate has been removed). Similarly, as used herein, the term “frontside” generally refers to the area above the one or more semiconductor devices (above the device layer) and includes an interconnect region having one or more interconnect layers with metal structures for carrying signal or power voltages. Note that the backside may become the frontside, and vice-versa, if a given structure is flipped. To this end, and as will be appreciated, the use of terms like “above” “below” “beneath” “upper” “lower” “top” and “bottom” are used to facilitate discussion and are not intended to implicate a rigid structure or fixed orientation; rather such terms merely indicate spatial relationships when the structure is in a given orientation.

Architecture

FIG. 1 is a cross-sectional view that illustrates an example portion of an integrated circuit configured with a carrier substrate having doped junctions and backside contacts, in accordance with an embodiment of the present disclosure. The cross-section may be taken through the semiconductor devices away from the source or drain regions (not visible in this cross-section). The semiconductor devices in this example are non-planar metal oxide semiconductor (MOS) transistors, such as tri-gate or gate-all-around (GAA) transistors, although other transistor topologies and types can also benefit from the techniques provided herein, as will be appreciated (e.g., planar transistors, thin film transistors, or any other transistors to which contact can be made).

As can be seen, the integrated circuit includes several indicated regions that are stacked over one another. According to some embodiments, the integrated circuit includes a device region 102, an interconnect region 104 over the device region 102, a carrier region 106 over the interconnect region 104, and a backside region 108 beneath the device region 102. Backside region 108 is considered to be beneath device region 102 since backside region 108 is formed in the area previously occupied by the device substrate as described in more detail with reference to FIGS. 4A-4C. Likewise, interconnect region 104 and carrier region 106 are considered to be over device region 102 as these regions are on the opposite side of device region 102 compared to backside region 108. Device region 102 includes a plurality of semiconductor devices 110 along with one or more other layers or structures associated with the semiconductor devices 110. For example, a dielectric layer 112 may be used to provide shallow trench isolation (STI) between adjacent semiconductor devices 110. Furthermore, another layer 116 can surround the active portions of the semiconductor devices 110 and can be an interlayer dielectric or a gate layer. In some embodiments, device region 102 also includes a portion of a device substrate from which semiconductor devices 110 are formed from or on (the device substrate has been removed in this illustrated example).

Interconnect region 104 includes a plurality of interconnect layers stacked over one another. Each interconnect layer can include a dielectric material 118 along with one or more different conductive features. Dielectric material 118 can be any dielectric, such as silicon oxide, silicon oxycarbide, silicon nitride, or silicon oxynitride. The one or more conductive features can include conductive traces 120 and conductive vias 122 arranged in any pattern across the interconnect layers to carry signal and/or power voltages to/from the various semiconductor devices 110.

Any of conductive traces 120 and conductive vias 122/123 can include any number of conductive materials, with some examples including copper, ruthenium, tungsten, cobalt, molybdenum, and alloys thereof. In some cases, any of conductive traces 120 and conductive vias 122/123 include a relatively thin liner or barrier, such as titanium nitride, titanium silicide, tungsten carbo-nitride (WCN), PVD or ALD tungsten, or tantalum nitride. The liner or barrier may be, for instance, 5 to 20 angstroms (e.g., 10 angstroms) thick.

According to some embodiments, a top-most layer of interconnect region 104 includes an additional plurality of conductive vias 123 that are arranged to make contact with corresponding conductive pads 124 on a carrier substrate 125. Carrier substrate 125 is part of carrier region 106 which also includes a dielectric layer 126 on a top surface of carrier substrate 125, according to some embodiments. Conductive pads 124 may be set into dielectric layer 126 to form a planarized top surface to be bonded to the top-most layer of interconnect region 104. Dielectric layer 126 may include silicon oxide or any dielectric material that matches dielectric material 118. Conductive pads 124 may include any conductive material noted above for conductive vias 123. According to some embodiments, conductive pads 124 includes the same conductive material used for conductive vias 123. Conductive pads 124 may include a stack of different conductive materials, such as a stack of metal or metal alloy layers.

Carrier substrate 125 includes a plurality of doped junctions such as doped region 128 and doped region 130. According to some embodiments, doped region 128 includes an NPN or PNP doping scheme to provide an ESD path through to the grounded carrier substrate 125. According to some embodiments, doped region 130 includes a PN junction to provide a diode path through to the grounded carrier substrate 125. The indication of p-doped regions and n-doped regions in FIG. 1 provide only one example and all such regions could also be doped with the opposite dopant type. N-type dopants may include phosphorous or arsenic while p-type dopants may include boron. Regions indicated as being p+ or n+ may include a dopant concentration between $5\times10^{19}$ cm$^{-3}$ and $5\times10^{21}$ cm$^{-3}$ while regions indicated as being n or p may include a dopant concentration between $1\times10^{15}$ cm$^{-3}$ and $5\times10^{18}$ cm$^{-3}$.

Backside region 108 includes one or more stacked interconnect layers similar to those used in interconnect region 104. Accordingly, backside region 108 may include layers that have dielectric material 132 along with one or more different conductive features within each layer, such as conductive traces 134 and conductive vias 136. Conductive traces 134 and conductive vias 136 may have material properties similar to those discussed above for conductive traces 120 and conductive vias 123. The one or more conductive features of backside region 108 can include conductive traces 134 and conductive vias 136 arranged in any pattern across the backside interconnect layers to carry signal and/or power voltages to/from the various semiconductor devices 110. According to some embodiments, one or more of conductive traces 134 may be designed for exclusively carrying power voltages (e.g., VDD or VSS voltages) and thus may be wider and/or thicker than conductive traces 120. In some embodiments, any of the conductive features of backside region 108 are electrically coupled to one or more input/output (I/O) structures 138 to provide signal and/or power coupling with a chip package or printed circuit board (PCB). I/O structures 138 may include solder bumps, metal pads, wire bonds, decoupling capacitors such as metal-insulator-metal (MIM), a ball grid array (BGA), a pin grid array (PGA), or a land grid array (LGA), to name a few examples.

Device region 102 may also include one or more conductive structures 140 that extend through device region 102 and connect between any conductive trace 120 or conductive via 122 from interconnect region 104 and any conductive trace 134 or conductive via 136 from backside region 108, according to some embodiments. Conductive structures 140 may be used to provide power and or signal voltages between interconnect region 104 and backside region 108.

It should be noted that each of the various conductive vias 122/123/136 are shown with tapered profiles to indicate a more natural appearance due to the etching process used to form the openings. Any degree of tapering may be observed depending on the etch parameters used and the thickness of the dielectric layer being etched through. Furthermore, conductive vias may be stacked one over the other through different dielectric layers of either interconnect region 104 or backside region 108, as illustrated. However, in some examples, a single via recess may be formed through more than one dielectric layer yielding a taller, more tapered conductive via that extends through two or more dielectric layers. Although not illustrated for clarity, conductive structures 140 may also include a tapered profile like any of conductive vias 122/123/136.

Fabrication Methodology

Figure 2A:
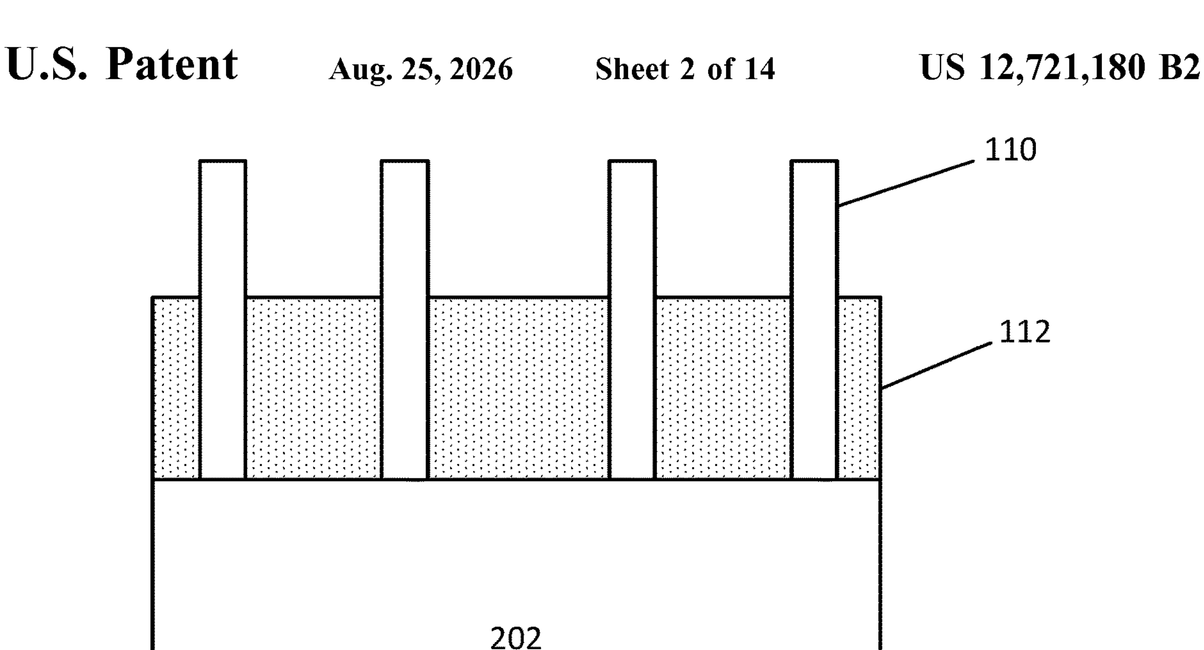
FIGS. 2A-2C are cross-sectional views that collectively illustrate an example process for forming a portion of an integrated circuit having conductive contacts that can subsequently be used as backside conductive contacts when the integrated circuit is flipped and bonded to a carrier substrate, in accordance with an embodiment of the present disclosure.
Figure 2B:
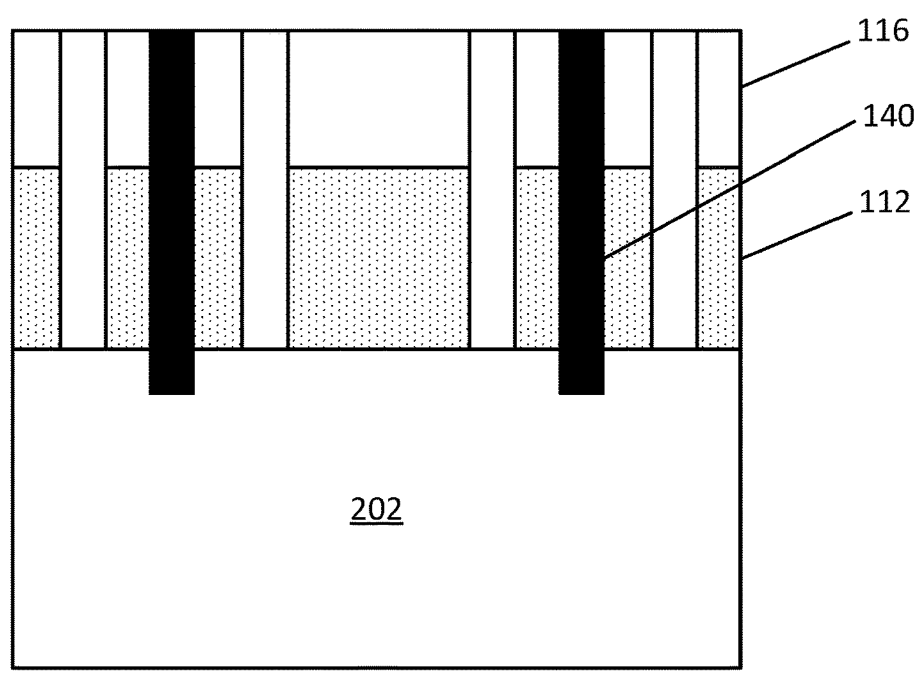
Figure 2C:
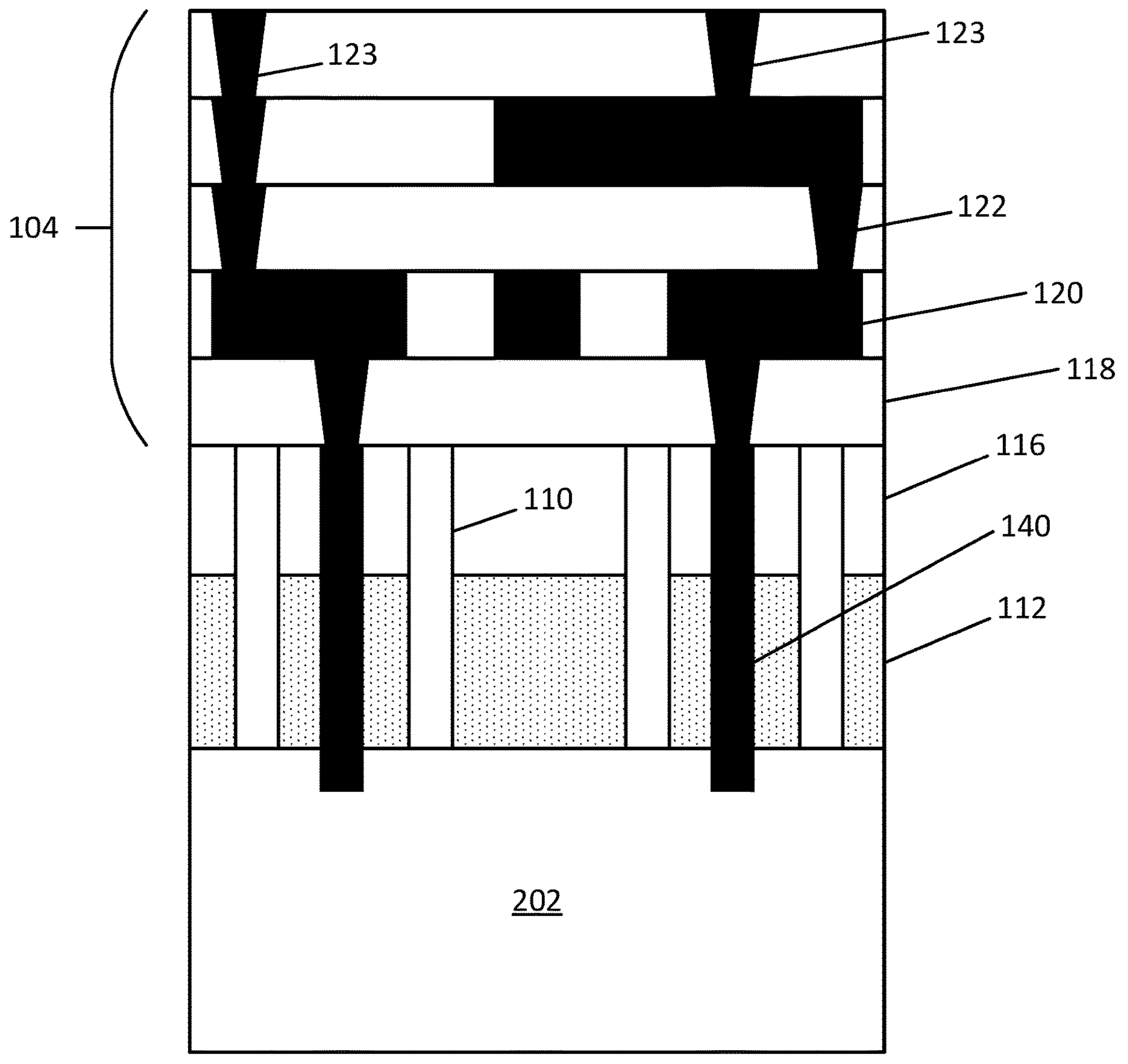

FIGS. 2A-2C are cross-sectional views that collectively illustrate an example process for forming the device region and interconnect region of an integrated circuit, in accordance with an embodiment of the present disclosure. Each figure shows an example structure that results from the process flow up to that point in time, so the depicted structure evolves as the process flow continues, culminating in the structure shown in FIG. 2C. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated.

FIG. 2A is a cross sectional view taken through a plurality of semiconductor devices 110 formed on or over a device substrate 202, according to some embodiments. Substrate 202 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 202 can be a semiconductor-on-insulator substrate having a desired semiconductor layer over a buried insulator layer (e.g., silicon over silicon dioxide). Alternatively, substrate 202 can be a multilayer substrate or superlattice suitable for forming nanowires or nanoribbons (e.g., alternating layers of silicon and SiGe, or alternating layers indium gallium arsenide and indium phosphide). Any number of substrates can be used.

Any number of semiconductor devices 110 may be included, but four are used here as an example. Semiconductor devices 110 may be finFET devices having one or more fins of active semiconductor material that extend between a source and drain region, or GAA devices that include semiconductor nanoribbons or nanowires that extend between a source and drain region. The fins or nanowires/nanoribbons of the semiconductor devices 110 can be, for example, native to the substrate (formed from the substrate itself), such as silicon fins etched from a bulk silicon substrate. Alternatively, the fins or nanowires/nanoribbons can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the nanowires and nanoribbons during a gate forming process where one type of the alternating layers are selectively etched away so as to liberate the other type of alternating layers within the channel region, so that the gate-all-around (GAA) process can then be carried out. Again, the alternating layers can be blanket deposited and then etched into fins, or deposited into fin-shaped trenches. Other embodiments may use planar transistor architecture, such that there are no fins, nanowires, or nanoribbons.

Although not shown in this cross-section, semiconductor devices 110 include source or drain regions, which can be epitaxial source or drain regions that are provided on the fins in an etch-and-replace process. In other embodiments one or both of the source or drain regions could be, for example, implantation-doped native portions of the fins or substrate 202. Any semiconductor materials suitable for source and drain regions can be used (e.g., group IV and group III-V semiconductor materials). The source and drain regions may include multiple layers such as liners and capping layers to improve contact resistance. In any such cases, the composition and doping of source or drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, the fins of the semiconductor devices 110 extend above a dielectric layer 112 that acts as an STI layer between the semiconductor devices 110. Dielectric layer 112 can be any suitable dielectric material, such as silicon dioxide, silicon nitride, silicon oxynitride, or silicon oxycarbonitride.

FIG. 2B is the cross-sectional view of the structure depicted in FIG. 2A, after formation of conductive structures 140 and layer 116, according to an embodiment of the present disclosure. Layer 116 may be an interlayer dielectric deposited using any conventional deposition technique, such as chemical vapor deposition (CVD), plasma-enhanced chemical vapor deposition (PECVD), flowable CVD, spin-on dielectric, or atomic layer deposition (ALD). Afterwards, a deep via etch may be performed through layer 116, dielectric layer 112, and into a portion of substrate 202. The deep via etch may use reactive ion etching (RIE) or deep reactive ion etching (DRIE) techniques. After the etch has been performed, the conductive structures 140 are formed by depositing a conductive material into the etched recesses. The conductive material can include copper, ruthenium, tungsten, cobalt, molybdenum, or alloys thereof, to name a few examples. According to some embodiments, the conductive material is deposited using any of electroplating, electroless plating, CVD, ALD, or PECVD techniques. The conductive structures 140 can act as backside contact structures or deep via boundary (DVB) structures to make electrical contact to the backside conductive features that will be formed in a later process. Following deposition of the conductive material for conductive structures 140, any excess material on the surface of layer 116 is polished away to planarize the top surfaces of layer 116 and conductive structures 140. Note that the planarized top surface of layer 116 may extend above the top surfaces of semiconductor devices 110.

FIG. 2C is the cross-sectional view of the structure depicted in FIG. 2B, after formation of interconnect region 104 above the semiconductor devices 110, according to an embodiment of the present disclosure. Each of the layers of interconnect region 104 may be formed one after the other starting with the bottom-most layer directly on layer 116 and ending with the top-most layer having top conductive vias 123. According to some embodiments, each layer includes a dielectric material 118 deposited using any conventional deposition technique, such as CVD, PECVD, flowable CVD, spin-on dielectric, or ALD. Furthermore, each layer includes one or more conductive features such as conductive traces 120 and/or conductive vias 122, as discussed above with reference to FIG. 1. At least some of the conductive traces 120 or conductive vias 122 are provided within the first layer of interconnect region 104 to make contact with corresponding conductive structures 140, according to some embodiments. Furthermore, in some embodiments, the topmost layer of interconnect region 104 includes a plurality of top conductive vias 123 that are arranged to line up with corresponding conductive pads on a substrate carrier, as will be discussed further herein. According to some embodiments, all conductive features (e.g., traces and vias) throughout interconnect region 104 are electrically coupled to at least one of top vias 123 such that all conductive features of interconnect region 104 (and similarly of device region 102) can be electrically tied to a single potential (e.g., grounded) through top vias 123.

Figure 3A:
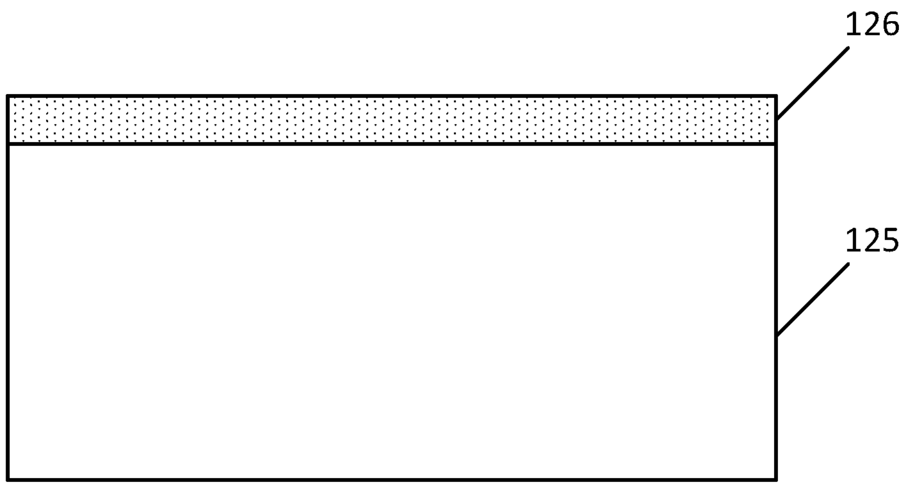
FIGS. 3A-3C are cross-sectional views that collectively illustrate an example process for forming a carrier substrate with integrated junctions, in accordance with an embodiment of the present disclosure.
Figure 3B:
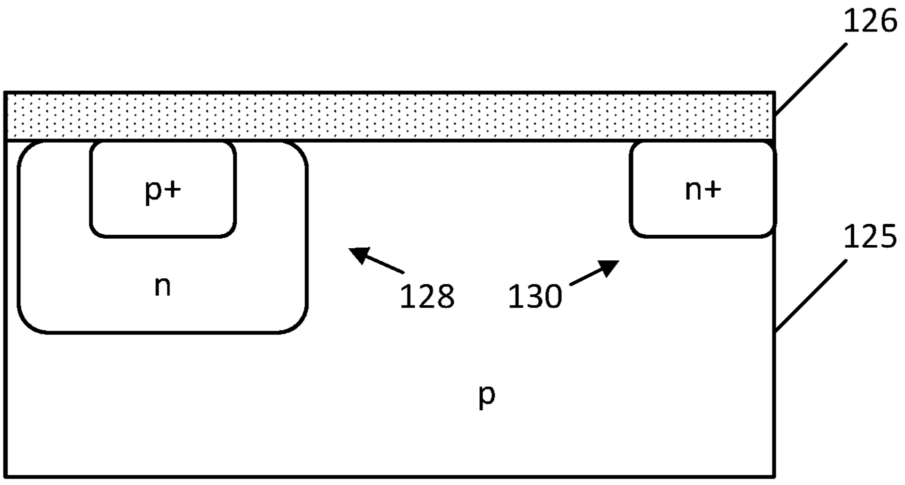
Figure 3C:
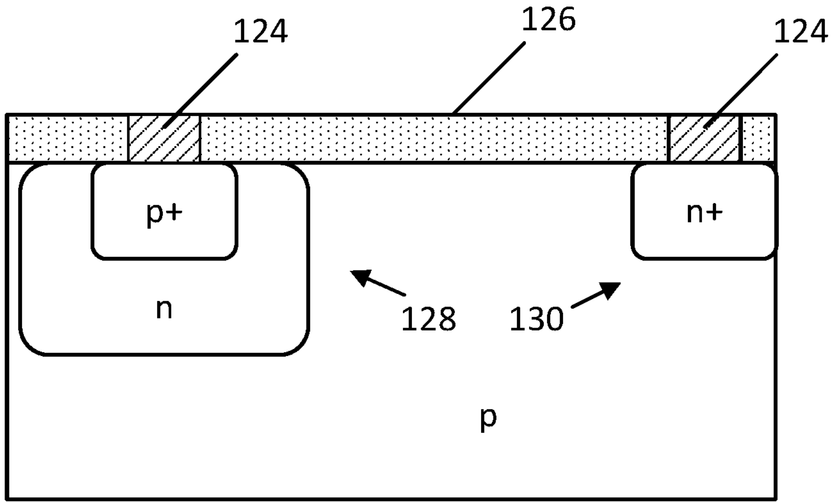

FIGS. 3A-3C are cross-sectional views that collectively illustrate an example process for forming a carrier substrate for use on an integrated circuit, in accordance with an embodiment of the present disclosure. Each figure shows an example structure that results from the process flow up to that point in time, so the depicted structure evolves as the process flow continues, culminating in the structure shown in FIG. 3C. Such a structure may be bonded to another integrated circuit structure (e.g., such as a processor or memory chip) that includes, for example, digital logic cells and/or memory cells and analog mixed signal circuitry. Example materials and process parameters are given, but the present disclosure is not intended to be limited to any specific such materials or parameters, as will be appreciated.

FIG. 3A illustrates a cross-section view of a carrier substrate 125 having dielectric layer 126 on a top surface of carrier substrate 125, according to an embodiment. Carrier substrate 125 may be similar to device substrate 202 and the discussion regarding device substrate 202 is equally applicable to carrier substrate 125. Dielectric layer 126 may be any dielectric material, although in some embodiments, dielectric layer 126 is the same material as the dielectric material used in the layers of interconnect region 104. Dielectric layer 126 may be deposited using any conventional deposition technique, such as CVD, PECVD, flowable CVD, spin-on dielectric, or ALD.

FIG. 3B is the cross-sectional view of the structure depicted in FIG. 3A, after formation of doped regions 128 and 130 within substrate 125, according to an embodiment of the present disclosure. Any of doped regions 128 and 130 may be forward biased to provide an electrical pathway through carrier substrate 125 (which itself is doped). In some embodiments, carrier substrate 125 is grounded during subsequent IC processing operations (such as backside processing operations), and doped regions 128 and 130 can be forward biased to ground any conductive features coupled through doped regions 128 and 130.

According to some embodiments, doped region 130 represents a diode structure while doped region 128 represents an ESD structure. Any number of such diode structures or ESD structures can be provided across carrier substrate 125, along with any number of other types of doped regions. Each of the illustrated n+ well, p+ well, and n well can be formed using ion implantation or diffusion. Each of the n+ well and p+ well may include a dopant concentration between about $5\times10^{19}$ cm$^{-3}$ and $5\times10^{21}$ cm$^{-3}$. The n well may include a dopant concentration between about $5\times10^{16}$ cm$^{-3}$ and $5\times10^{18}$ cm$^{-3}$. Carrier substrate 125 may be natively doped using p-type dopants at a dopant concentration between about $1\times10^{14}$ cm$^{-3}$ and $2\times10^{15}$ cm$^{-3}$. As noted above, the illustrated dopant types are one example only, and the opposite dopant types may be used as well, such that substrate 125 is n-type doped, region 128 has an NPN structure and doped region 130 includes a p+ well.

FIG. 3C is the cross-sectional view of the structure depicted in FIG. 3B, after formation of conductive pads 124, according to an embodiment of the present disclosure. Recesses may be etched through dielectric layer 126 above one or more of the doped regions, such as doped regions 128 and 130, using RIE or any other suitable anisotropic dry etching technique. Afterwards, the recesses may be filled with conductive material to form conductive pads 124. The conductive material can include any number of conductive materials, with some example such materials including copper, ruthenium, tungsten, cobalt, molybdenum, and alloys thereof. According to some embodiments, conductive pads 124 include the same conductive material as vias 123 to facilitate a stronger metal-metal bond between conductive pads 124 and vias 123, as will be further discussed herein. According to some embodiments, the top surfaces of dielectric layer 126 and conductive pads 124 are polished (e.g., using CMP) to create the illustrated planarized surface along the top of dielectric layer 126 and conductive pads 124. The polished surface provides a smooth surface to facilitate a stronger bond with interconnect region 104 and ensures that any excess conductive material not present within the recesses through dielectric layer 126 is removed.

Figure 4A:
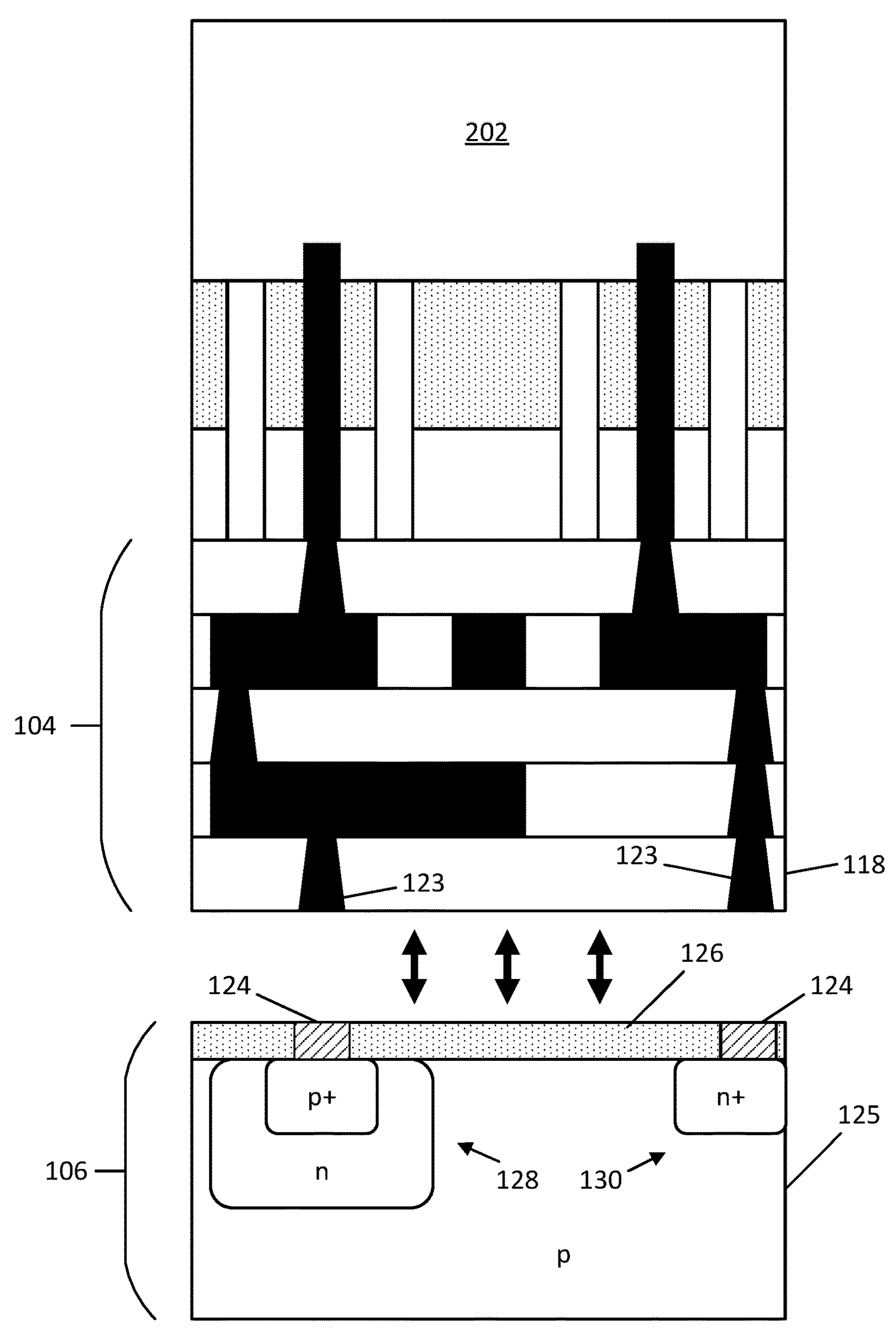
FIGS. 4A-4C are cross-sectional views that collectively illustrate an example process for bonding the carrier substrate of FIGS. 3A-3C to the integrated circuit portion of FIGS. 2A-2C, in accordance with an embodiment of the present disclosure.
Figure 4B:
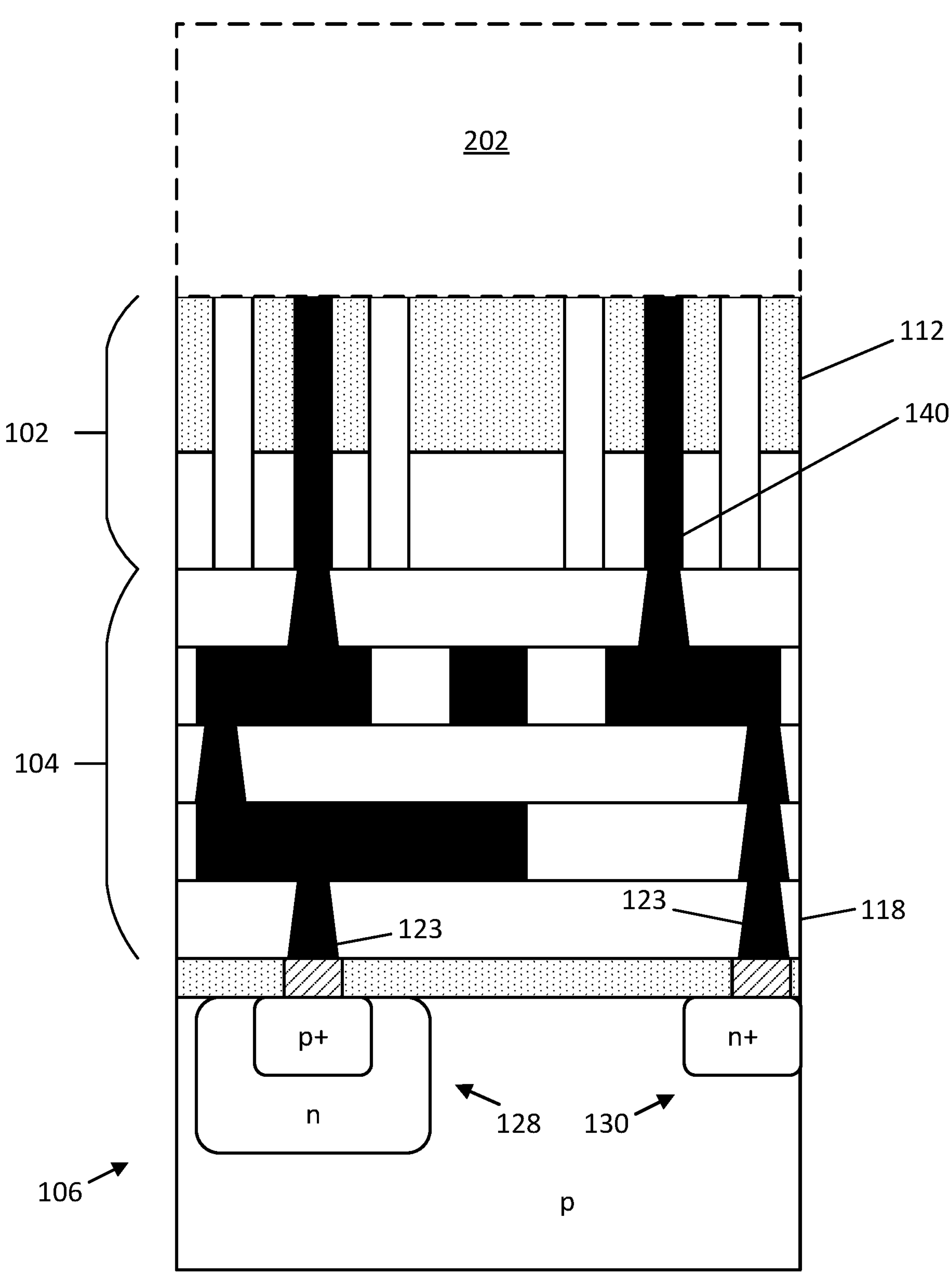
Figure 4C:
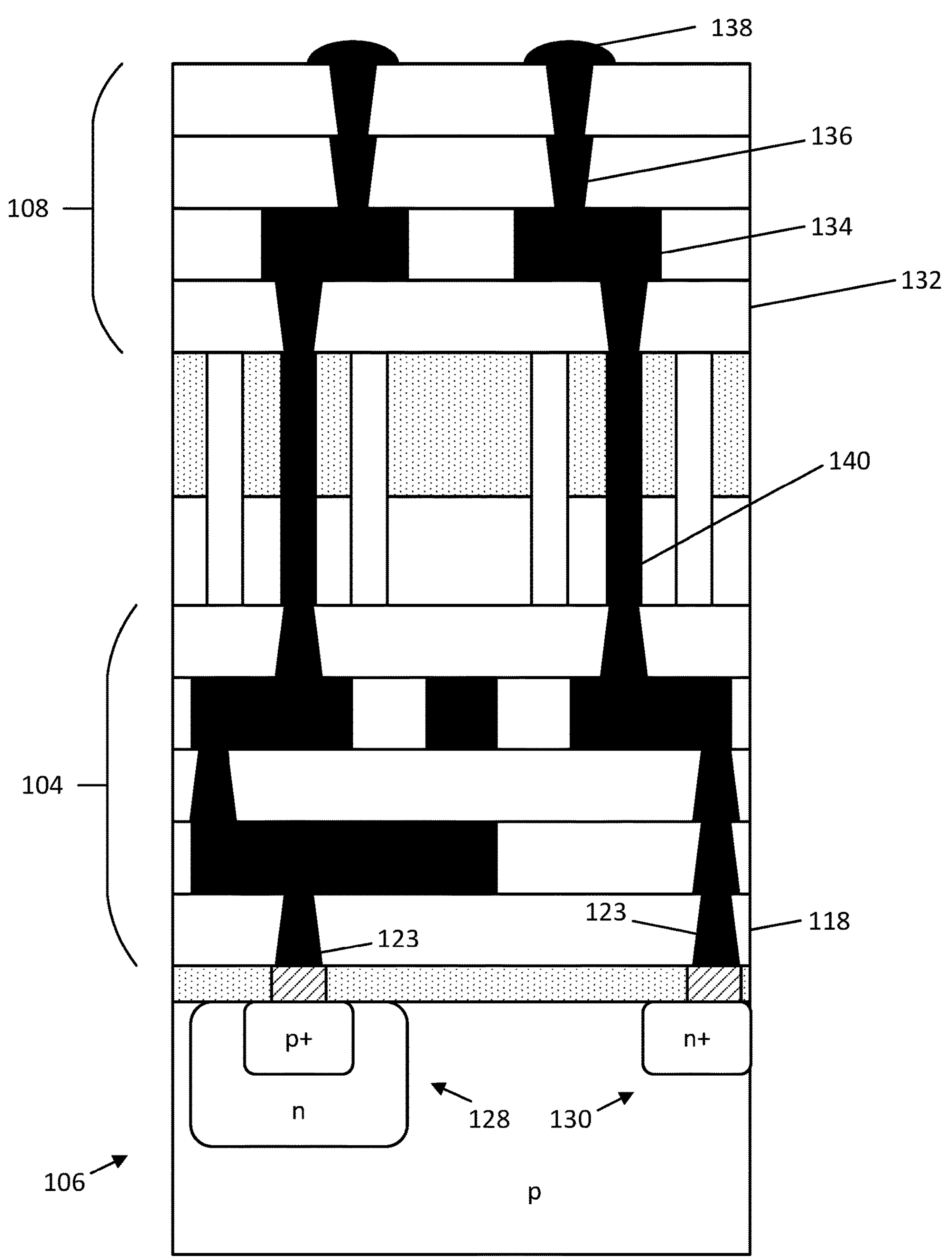

FIGS. 4A-4C are cross-sectional views that collectively illustrate an example process for bonding a carrier substrate to a device substrate and proceeding with backside operations on the device substrate, in accordance with an embodiment of the present disclosure. Each figure shows an example structure that results from the process flow up to that point in time, so the depicted structure evolves as the process flow continues, culminating in the structure shown in FIG. 4C. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated.

FIG. 4A illustrates a bonding process between interconnect region 104 and carrier region 106, according to an embodiment of the present disclosure. Carrier region 106 may be aligned such that one or more of conductive pads 124 on carrier substrate 125 make contact with one or more corresponding conductive vias 123 of interconnect region 104. As the two regions are brought together, a bond may be formed along the interface between interconnect region 104 and carrier region 106. More specifically, the interface between dielectric material 118 and dielectric layer 126 fuse together in a thermal bonding process while the interface between conductive vias 123 and corresponding conductive pads 124 undergo a metal-metal bonding where an application of heat causes the metals to reflow and form a bond. In some examples, the bonding procedure is a hybrid bonding process involving the application of both pressure and high temperatures between about 200 C and about 450 C to cause the oxide surfaces to fuse together and the metal surfaces to reflow together.

FIG. 4B is the cross-sectional view of the structure depicted in FIG. 4A, after bonding is complete and device substrate 202 has been removed, according to an embodiment of the present disclosure. The dotted area designates the previous location of substrate 202, which may be removed partially or entirely from the backside of device region. According to some embodiments, device substrate 202 is removed using CMP until dielectric layer 112 is reached. Other removal processes may involve any dry plasma-based etches or wet etchants to remove the semiconductor material. According to some embodiments, any portion of conductive structures 140 present within substrate 202 may also be removed such that a planarized surface across conductive structures 140 and dielectric layer 112 is created.

FIG. 4C is the cross-sectional view of the structure depicted in FIG. 4B, following the completion of backside region 108, according to an embodiment of the present disclosure. Backside region 108 may be formed in the region that had previously been occupied by device substrate 202. As noted above with reference to FIG. 1, backside region 108 may be formed in a similar fashion to interconnect region 104, having one or more stacked backside interconnect layers with dielectric material 132, conductive traces 134, and conductive vias 136 arranged in any pattern. In some embodiments, any of the conductive features of backside region 108 are electrically coupled to one or more I/O structures 138 to provide signal and/or power coupling with a chip package or printed circuit board (PCB). I/O structures 138 may include solder bumps, metal pads, decoupling capacitors such as metal-insulator-metal (MIM), wire bonds, a ball grid array (BGA), a pin grid array (PGA), or a land grid array (LGA), to name a few examples. Furthermore, one or more of the conductive features within backside region 108 are formed to contact conductive structures 140 such that power and/or signals are provided between backside region 108 and interconnect region 104 through any of conductive structures 140.

Figure 5A:
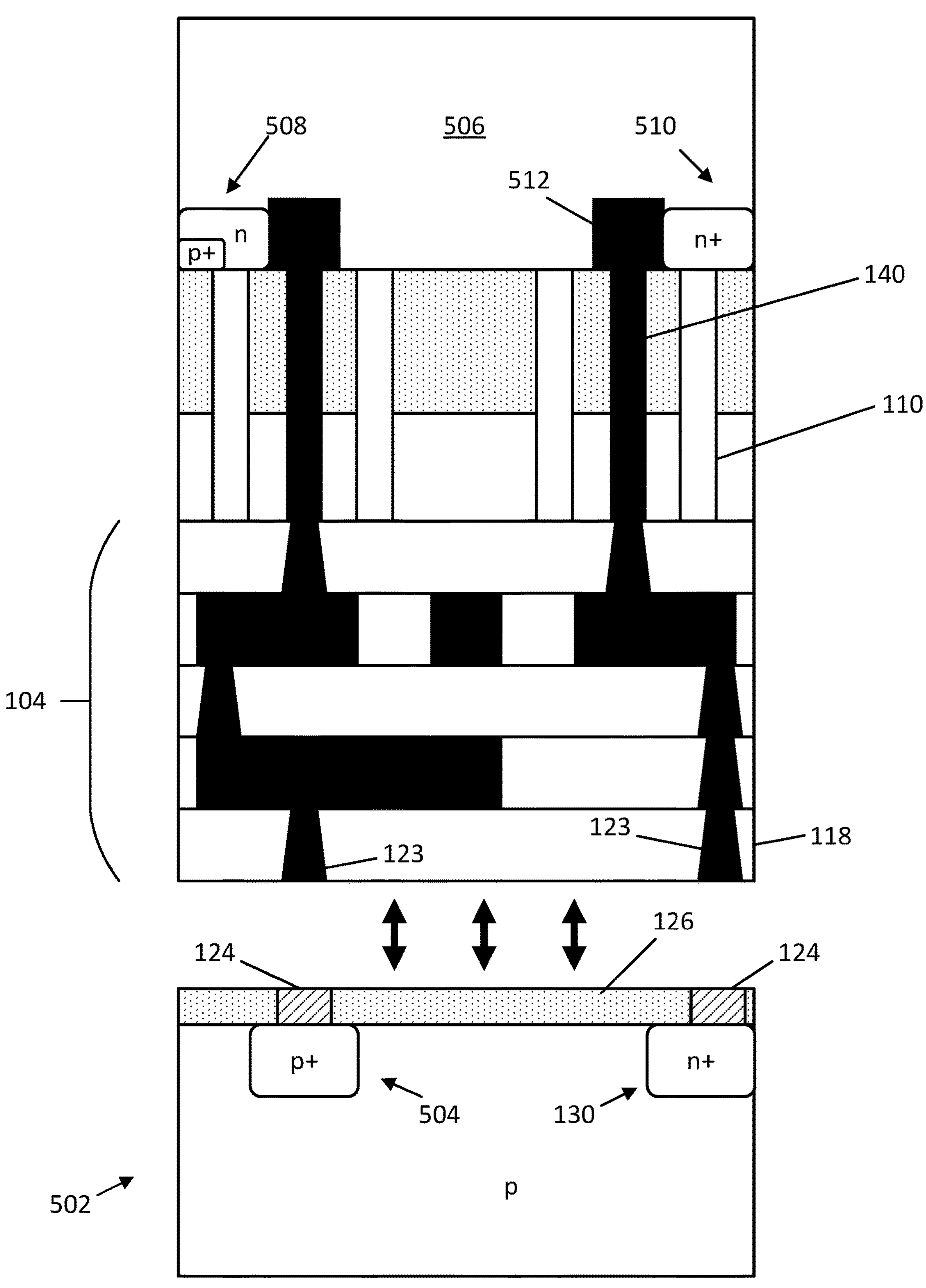
FIGS. 5A-5C are cross-sectional views that collectively illustrate an example process for bonding a different carrier substrate to an integrated circuit having a different substrate design, in accordance with an embodiment of the present disclosure.
Figure 5B:
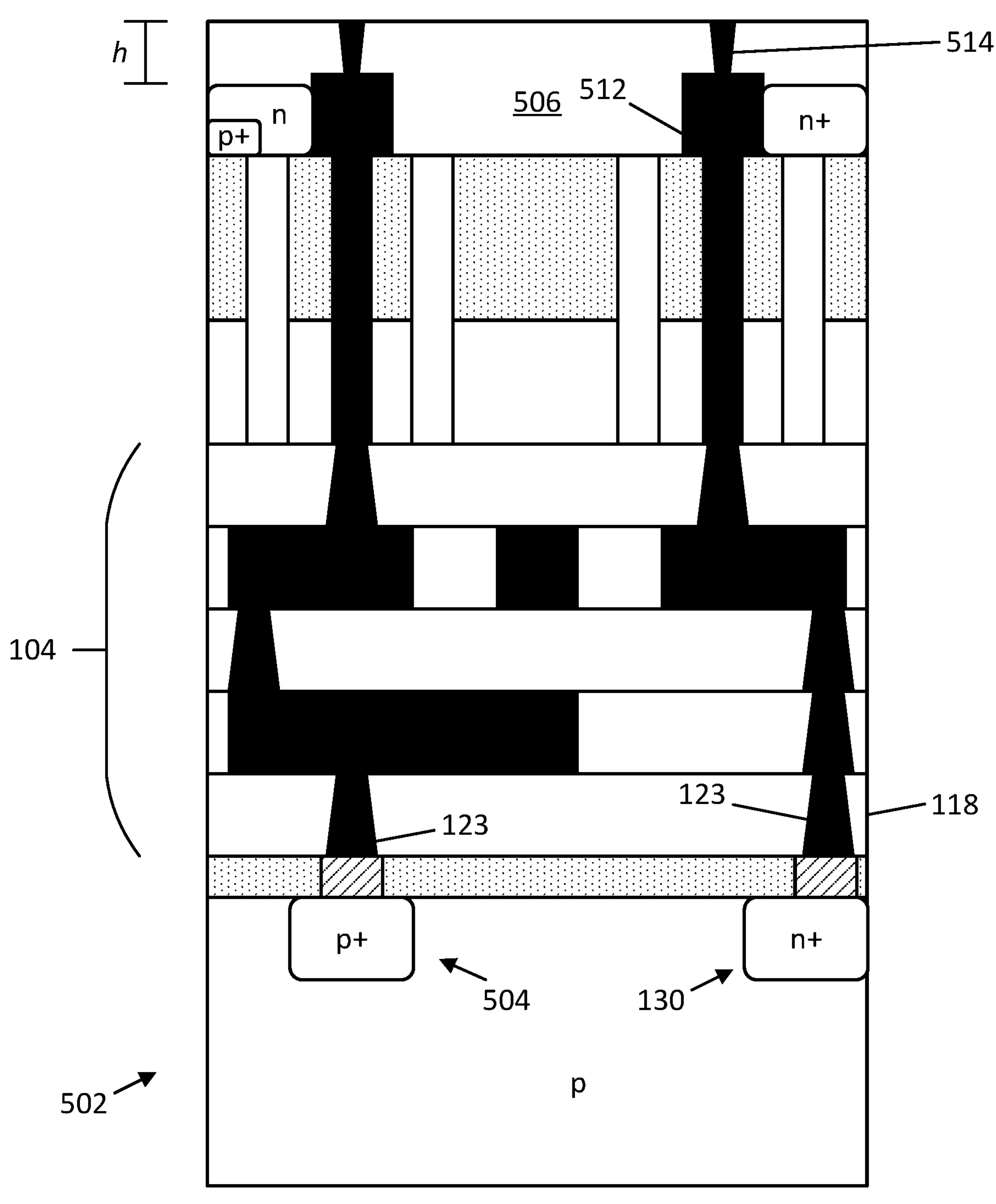
Figure 5C:
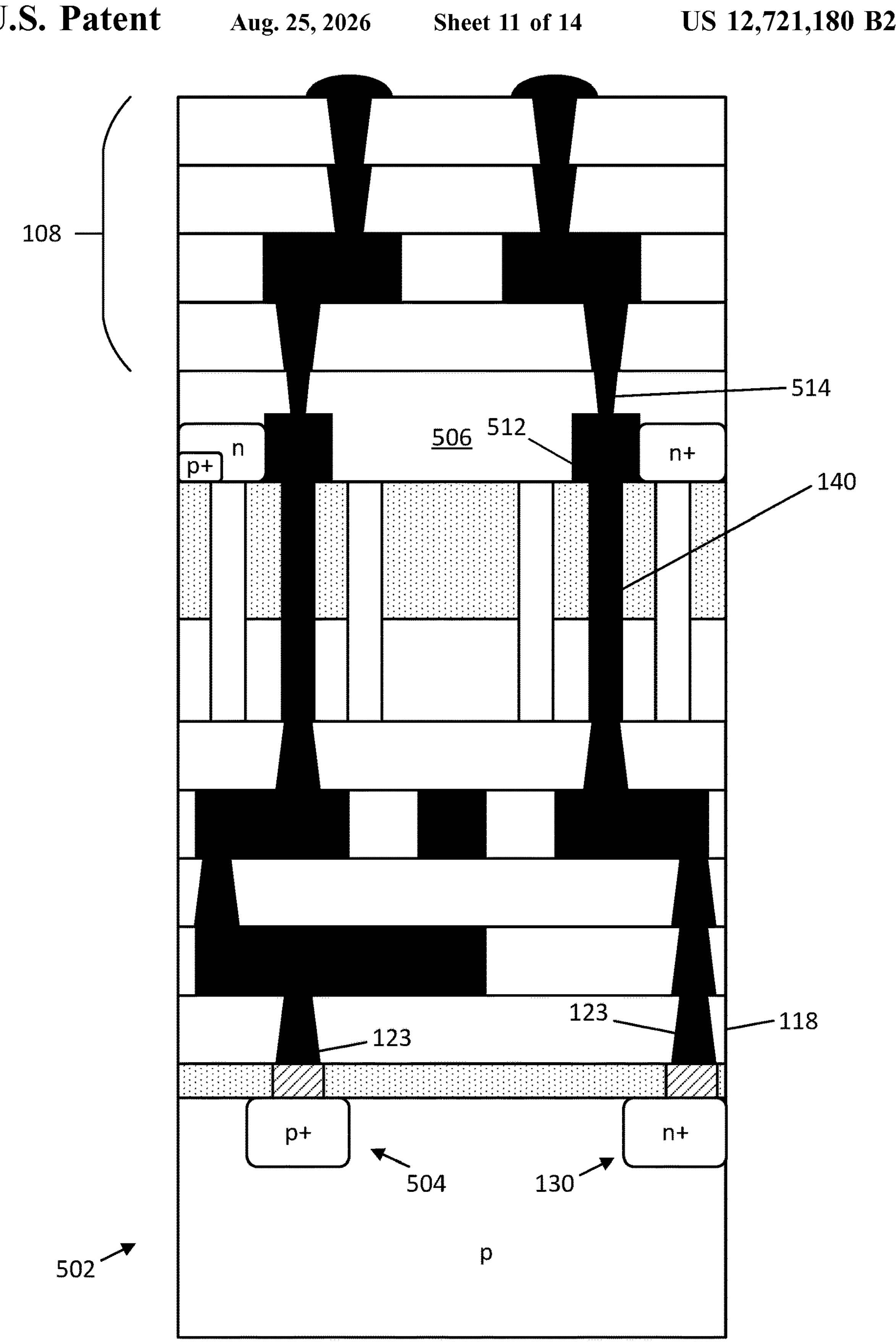

FIGS. 5A-5C are cross-sectional views that collectively illustrate another example process for bonding a carrier substrate to a device substrate and proceeding with backside operations on the device substrate, in accordance with an embodiment of the present disclosure. Each figure shows an example structure that results from the process flow up to that point in time, so the depicted structure evolves as the process flow continues, culminating in the structure shown in FIG. 5C. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated.

FIG. 5A illustrates a bonding process between interconnect region 104 and a carrier substrate 502, according to an embodiment of the present disclosure. The process is similar to the bonding process described above with reference to FIG. 4A, where the oxide surfaces bond together and the metal surfaces between conductive vias 123 and conductive pads 124 bond together. However, in this example, the structures of carrier substrate 502 and device substrate 506 are different. Specifically, the various doped junctions in carrier substrate 502 include diode junctions 130 as described above, and doped junctions 504. The NPN or PNP junctions used in carrier substrate 125 are not provided within carrier substrate 502 as these regions have instead been moved to a device substrate 506. Device substrate 506 may be similar to device substrate 202 except for the inclusion of additional doped regions 508 and 510.

Device substrate 506 may include a plurality of various doped regions such as doped region 508 and doped region 510. According to some embodiments, doped region 510 represents a diode structure while doped region 508 represents an ESD structure. Any number of such diode structures or ESD structures can be provided across device substrate 506, along with any number of other types of doped regions. Each of the illustrated n+ well, p+ well, and n well regions in either device substrate 506 or carrier substrate 502 can be formed using ion implantation or diffusion. Each of the n+ well and p+ well may include a dopant concentration between about $5\times10^{19}$ $cm^{-3}$ and $5\times10^{21}$ $cm^{-3}$. The n well may include a dopant concentration between about $5\times10^{16}$ $cm^{-3}$ and $5\times10^{18}$ $cm^{-3}$. Both device substrate 506 and carrier substrate 502 may be natively doped using p-type dopants at a dopant concentration between about $1\times10^{14}$ $cm^{-3}$ and $2\times10^{15}$ $cm^{-3}$. As noted above, the illustrated dopant types are one example only, and the opposite dopant types may be used as well, such that device substrate 506 is n-type doped, region 508 has an NPN structure and doped region 510 includes a p+ well.

According to some embodiments, device substrate 502 also include one or more buried conductive layers 512. In the illustrated example, buried conductive layers 512 are provided within a portion of device substrate 506 between adjacent semiconductor devices 110. Buried conductive layer 512 can be any conductive material, such as any metal or metal alloy, that may include any of tungsten, molybdenum, ruthenium, cobalt, copper, aluminum, or silver. According to some embodiments, buried conductive layer 512 provides a VDD or VSS buried or backside power rail (BPR) to various semiconductor devices of the integrated circuit. In some embodiments, conductive structures 140 make contact with corresponding buried conductive layers 512 to bring VDD or VSS power up to one or more of the various conductive structures of interconnect region 104.

FIG. 5B is the cross-sectional view of the structure depicted in FIG. 5A, after bonding is complete and a portion of device substrate 506 has been removed, according to an embodiment of the present disclosure. According to some embodiments, a portion of device substrate 506 is removed in order to maintain at least the various doped junction regions and buried conductive layers 512. According to some embodiments, the portion of device substrate 506 is removed using CMP until a height h is reached with respect to buried conductive layers 512. Other removal processes may involve any dry plasma-based etches or wet etchants to remove the semiconductor material of device substrate 502. The height h can be any height to ensure that the doped regions within device substrate 506 and the buried conductive layers 512 are not damaged by the removal of the portion of device substrate 506. In some examples, the height h is between about 100 nm and about 1000 nm.

According to some embodiments, conductive vias 514 are formed through the identified height h of substrate 506 to make contact with corresponding buried conductive layers 512. Conductive vias 514 may include any of the conductive materials disclosed above for any of vias 123. In some embodiments, conductive vias 514 may have a smaller width compared to vias 123 due to the height h being smaller than the thickness of a given interconnect layer from interconnect region 104. Since conductive vias 514 are formed through a semiconductor material (as opposed to a dielectric material like conductive vias 123), a thin insulating layer may be deposited first followed by the metal material to isolate conductive vias 514 from the semiconductor material of device substrate 506. The insulating layer may include any dielectric material, such as silicon oxide or silicon nitride.

FIG. 5C is the cross-sectional view of the structure depicted in FIG. 5B, following the completion of backside region 108, according to an embodiment of the present disclosure. The formation process for backside region 108 has been described already with reference to FIG. 4C. In the illustrated example, rather than form conductive vias within backside region 108 to contact conductive structures 140, conductive vias are formed to contact conductive vias 514 and complete an electrical pathway between one or more conductive features of backside region 108 and one or more conductive features of interconnect region 104.

Figure 6:
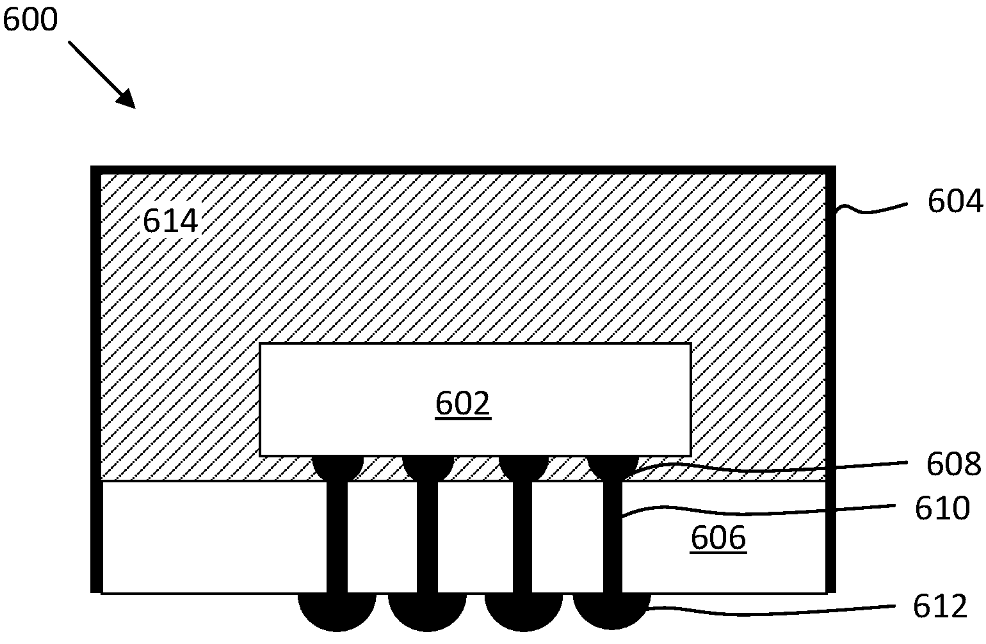
FIG. 6 illustrates a cross-section view of a chip package containing one or more semiconductor dies, in accordance with some embodiments of the present disclosure.

FIG. 6 illustrates an example embodiment of a chip package 600, in accordance with an embodiment of the present disclosure. As can be seen, chip package 600 includes one or more dies 602. One or more dies 602 may include at least one integrated circuit having a structure as described in any of the aforementioned embodiments. One or more dies 602 may include any other circuitry used to interface with other devices formed on the dies, or other devices connected to chip package 600, in some example configurations.

As can be further seen, chip package 600 includes a housing 604 that is bonded to a package substrate 606. The housing 604 may be any standard or proprietary housing, and may provide, for example, electromagnetic shielding and environmental protection for the components of chip package 600. The one or more dies 602 may be conductively coupled to a package substrate 606 using connections 608, which may be implemented with any number of standard or proprietary connection mechanisms, such as solder bumps, ball grid array (BGA), pins, or wire bonds, to name a few examples. In some embodiments, connections 608 are the same as I/O structures 138. Package substrate 606 may be any standard or proprietary package substrate, but in some cases includes a dielectric material having conductive pathways (e.g., including conductive vias and lines) extending through the dielectric material between the faces of package substrate 606, or between different locations on each face. In some embodiments, package substrate 606 may have a thickness less than 1 millimeter (e.g., between 0.1 millimeters and 0.5 millimeters), although any number of package geometries can be used. Additional conductive contacts 612 may be disposed at an opposite face of package substrate 606 for conductively contacting, for instance, a printed circuit board (PCB). One or more vias 610 extend through a thickness of package substrate 606 to provide conductive pathways between one or more of connections 608 to one or more of contacts 612. Vias 610 are illustrated as single straight columns through package substrate 606 for ease of illustration, although other configurations can be used (e.g., damascene, dual damascene, through-silicon via, or an interconnect structure that meanders through the thickness of substrate 606 to contact one or more intermediate locations therein). In still other embodiments, vias 610 are fabricated by multiple smaller stacked vias, or are staggered at different locations across package substrate 606. In the illustrated embodiment, contacts 612 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 612, to inhibit shorting.

In some embodiments, a mold material 614 may be disposed around the one or more dies 602 included within housing 604 (e.g., between dies 602 and package substrate 606 as an underfill material, as well as between dies 602 and housing 604 as an overfill material). Although the dimensions and qualities of the mold material 614 can vary from one embodiment to the next, in some embodiments, a thickness of mold material 614 is less than 1 millimeter. Example materials that may be used for mold material 614 include epoxy mold materials, as suitable. In some cases, the mold material 614 is thermally conductive, in addition to being electrically insulating.

Methodology

Figure 7:
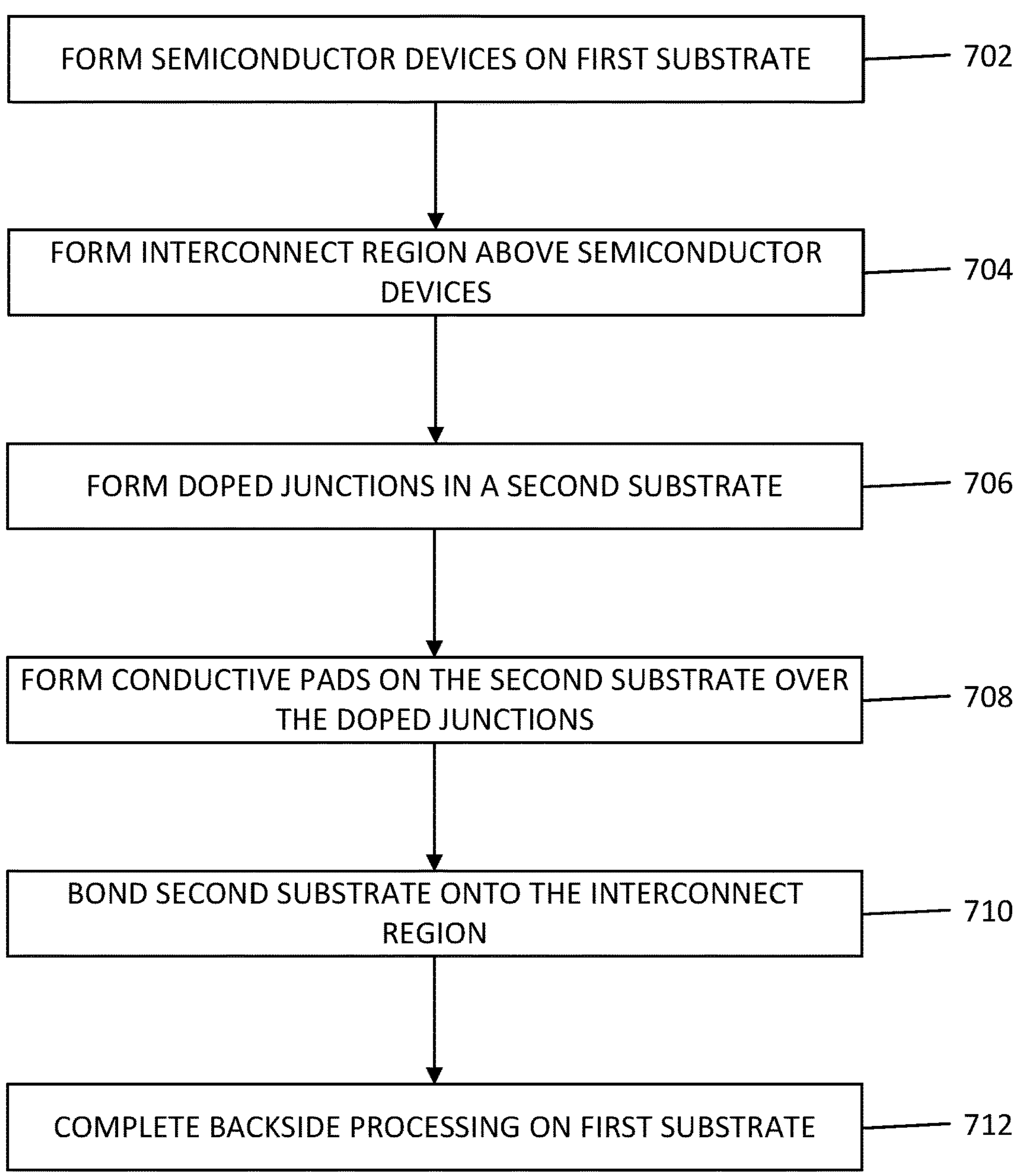
FIG. 7 is a flowchart of a fabrication process for an integrated circuit including a carrier substrate with integrated junctions, in accordance with an embodiment of the present disclosure.

FIG. 7 is a flow chart of a method 700 for forming at least a portion of an integrated circuit, according to an embodiment. Various operations of method 700 may be illustrated in FIGS. 2A-2C, 3A-3C, 4A-4C, and 5A-5C. However, the correlation of the various operations of method 700 to the specific components illustrated in the aforementioned figures is not intended to imply any structural and/or use limitations. Rather, the aforementioned figures provide one example embodiment of method 700. Other operations may be performed before, during, or after any of the operations of method 700. For example, method 700 does not explicitly describe many steps that are performed to form common transistor structures. Some of the operations of method 700 may be performed in a different order than the illustrated order.

Method 700 begins with operation 702 where semiconductor devices are formed on a first substrate. The semiconductor devices may include finFET devices having one or more fins of active semiconductor material that extend between a source and drain region, or GAA devices that include semiconductor nanoribbons or nanowires that extend between a source and drain region, thin film transistors (TFTs), or planar MOSFETs. Any known fabrication process may be used to form any of the semiconductor devices.

Method 700 continues with operation 704 where an interconnect region is formed above the semiconductor devices. Each of the layers of the interconnect region may be formed one after the other. According to some embodiments, each layer includes a dielectric material deposited using any conventional deposition technique, such as CVD, PECVD, flowable CVD, spin-on dielectric, or ALD. Furthermore, each layer includes one or more conductive features such as conductive traces and/or conductive vias.

According to some embodiments, as part of the formation of interconnect region, conductive structures are formed that extend from the interconnect region down into at least a portion of the first substrate. These conductive structures act as backside contacts to facilitate an electrical connection between conductive features of the interconnect region and conductive features of a backside region that is formed during a later operation. At least some of the conductive traces or conductive vias are provided within the first layer of the interconnect region to make contact with corresponding conductive structures, according to some embodiments. Furthermore, in some embodiments, the top-most layer of the interconnect region includes a plurality of top conductive vias that are arranged to line up with corresponding conductive pads on a carrier substrate in a later operation. According to some embodiments, all of the conductive features (e.g., traces and vias) throughout the interconnect region 104 are electrically coupled to at least one of the top vias.

Method 700 continues with operation 706 where one or more doped junctions are formed within a second substrate. The doped junctions can include any number of diode structures or ESD structures. Other types of doped junctions can be included as well. A given doped junction may include any number of n-well or p-well regions that can formed using ion implantation or diffusion. According to some embodiments, the various doped junctions can be forward biased to provide an electrical pathway through the second substrate (e.g., in situations where the second substrate is grounded). In some embodiments, the doped junctions are formed within a semiconductor portion of the second substrate that includes a top dielectric layer, such as a layer of silicon oxide or silicon nitride.

Method 700 continues with operation 708, where conductive pads are formed on the second substrate over corresponding doped junctions. The conductive pads can include any number of conductive materials, with some example such materials including copper, ruthenium, tungsten, cobalt, molybdenum, and alloys thereof. According to some embodiments, the conductive pads include the same conductive material as used for the conductive vias of the interconnect region to facilitate a stronger metal-metal bond between the conductive pads and the conductive vias. In some embodiments, the conductive pads include the same conductive material as used specifically in one or more of the top conductive vias (present in the top-most interconnect layer) that align with the conductive pads to facilitate bonding between the second substrate and the interconnect region.

Method 700 continues with operation 710 where the second substrate is bonded to the interconnect region above the first substrate. The second substrate may be aligned such that one or more of its conductive pads make contact with one or more corresponding conductive vias of the interconnect region. As the two regions are brought together, a bond may be formed along the interface between the interconnect region 104 and the second substrate. More specifically, a hybrid bonding process occurs at the interface between similar dielectric materials (e.g., dielectric material in the top layer of the interconnect region and the top dielectric layer of the second substrate) and at the interface between similar metals (e.g., the conductive pads of the second substrate and the conductive vias of the interconnect region). The dielectric materials fuse together while the metals undergo a reflow process to form a metal-metal bond due to the application of heat and pressure.

Method 700 continues with operation 712 where backside processing operations are completed on the first substrate. During the backside processing operations, the first substrate may be electrically grounded to correspondingly ground any (or all) conductive features of the interconnect region and of the semiconductor devices. These grounded features reduce or eliminate plasma-induced ESD damage that can occur while performing any of the backside processing operations. Example backside operations include removing an entirely of the bulk semiconductor portion of the first substrate and forming a backside region similar to the interconnect region. Other example backside operations include removing only a portion of the first substrate and forming conductive vias through the semiconductor material of the first substrate to make contact with buried conductive layers within the first substrate.

Example System

Figure 8:
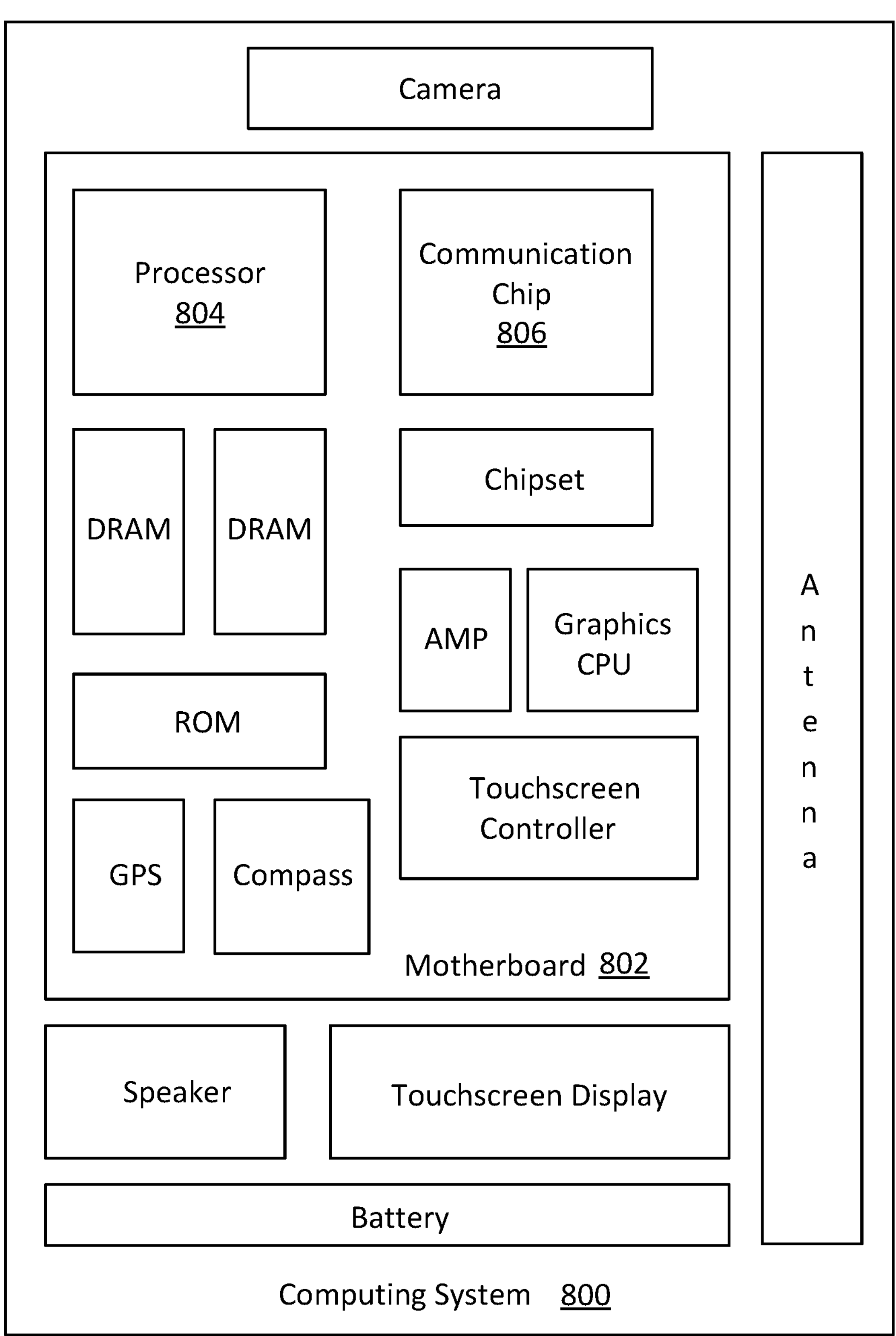
FIG. 8 illustrates a computing system including one or more integrated circuits, as variously described herein, in accordance with an embodiment of the present disclosure.

FIG. 8 is an example computing system implemented with one or more of the integrated circuit structures as disclosed herein, in accordance with some embodiments of the present disclosure. As can be seen, the computing system 800 houses a motherboard 802. The motherboard 802 may include a number of components, including, but not limited to, a processor 804 and at least one communication chip 806, each of which can be physically and electrically coupled to the motherboard 802, or otherwise integrated therein. As will be appreciated, the motherboard 802 may be, for example, any printed circuit board (PCB), whether a main board, a daughterboard mounted on a main board, or the only board of system 800, etc.

Depending on its applications, computing system 800 may include one or more other components that may or may not be physically and electrically coupled to the motherboard 802. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 800 may include one or more integrated circuit structures or devices configured in accordance with an example embodiment (e.g., a module including an integrated circuit having a carrier substrate with various doped junction coupled to the conductive features of an interconnect region, as variously provided herein). In some embodiments, multiple functions can be integrated into one or more chips (e.g., for instance, note that the communication chip 806 can be part of or otherwise integrated into the processor 804).

The communication chip 806 enables wireless communications for the transfer of data to and from the computing system 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing system 800 includes an integrated circuit die packaged within the processor 804. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 806 also may include an integrated circuit die packaged within the communication chip 806. In accordance with some such example embodiments, the integrated circuit die of the communication chip includes one or more semiconductor devices as variously described herein. As will be appreciated in light of this disclosure, note that multi-standard wireless capability may be integrated directly into the processor 804 (e.g., where functionality of any chips 806 is integrated into processor 804, rather than having separate communication chips). Further note that processor 804 may be a chip set having such wireless capability. In short, any number of processor 804 and/or communication chips 806 can be used. Likewise, any one chip or chip set can have multiple functions integrated therein.

In various implementations, the computing system 800 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 800 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a plurality of semiconductor devices, an interconnect region above the plurality of semiconductor devices and having a plurality of stacked interconnect layers, one or more metal features in any of the plurality of stacked interconnect layers, one or more conductive vias through one or more layers of the interconnect region and coupled to any of the one or more metal features, and a carrier substrate having a semiconductor material with one or more doped junctions and one or more conductive pads on corresponding ones of the one or more doped junctions. The carrier substrate is bonded to the interconnect region such that the one or more conductive pads are in contact with corresponding ones of the one or more conductive vias.

Example 2 includes the subject matter of Example 1, further comprising a backside region beneath the plurality of semiconductor devices, wherein the backside region comprises one or more additional metal features. In some such examples, the one or more additional metal features include a buried or backside power rail (BPR) structure.

Example 3 includes the subject matter of Example 2, further comprising one or more conductive structures that extend between a metal feature in the backside region and a metal feature in the interconnect region.

Example 4 includes the subject matter of Example 2 or 3, wherein the backside region comprises one or more input/output (I/O) structures.

Example 5 includes the subject matter of any one of Examples 2-4, wherein the plurality of semiconductor devices are on a substrate, wherein the substrate includes a semiconductor material with one or more doped junctions and the substrate is between the plurality of semiconductor devices and the backside region.

Example 6 includes the subject matter of Example 5, further comprising one or more conductive vias that extend through a portion of the substrate between a metal feature in the backside region and a buried conductive layer in the substrate.

Example 7 includes the subject matter of any one of Examples 1-6, wherein at least one of the one or more doped junctions includes a first doped well of a first dopant type and a second doped well of a second dopant type that is opposite to the first dopant type, the second doped well being within the first doped well.

Example 8 includes the subject matter of any one of Examples 1-7, wherein all of the metal features on the plurality of stacked interconnect layers are each electrically coupled to at least one of the one or more conductive vias.

Example 9 is a printed circuit board that includes the integrated circuit of any one of Examples 1-8.

Example 10 is an electronic device that includes a chip package having one or more dies. At least one of the one or more dies includes a plurality of semiconductor devices, an interconnect region above the plurality of semiconductor devices and having a plurality of stacked interconnect layers, one or more metal features in any of the plurality of stacked interconnect layers, one or more conductive vias through one or more layers of the interconnect region and coupled to any of the one or more metal features, and a carrier substrate having a semiconductor material with one or more doped junctions and one or more conductive pads on corresponding ones of the one or more doped junctions. The carrier substrate is bonded to the interconnect region such that the one or more conductive pads are in contact with corresponding ones of the one or more conductive vias.

Example 11 includes the subject matter of Example 10, wherein the at least one of the one or more dies further comprises a backside region beneath the plurality of semiconductor devices, wherein the backside region comprises one or more additional metal features. In some such examples, the one or more additional metal features include a buried or backside power rail (BPR) structure.

Example 12 includes the subject matter of Example 11, wherein the at least one of the one or more dies further comprises one or more conductive structures that extend between a metal feature in the backside region and a metal feature in the interconnect region.

Example 13 includes the subject matter of Example 11 or 12, wherein the backside region comprises one or more chip input/output (I/O) structures.

Example 14 includes the subject matter of any one of Examples 11-13, wherein the plurality of semiconductor devices are on a substrate, wherein the substrate includes a semiconductor material with one or more doped junctions and the substrate is between the plurality of semiconductor devices and the backside region.

Example 15 includes the subject matter of Example 14, wherein the at least one of the one or more dies further comprises one or more conductive vias that extend through a portion of the substrate between a metal feature in the backside region and a buried conductive layer in the substrate.

Example 16 includes the subject matter of any one of Examples 10-15, wherein at least one of the one or more doped junctions includes a first doped well of a first dopant type and a second doped well of a second dopant type that is opposite to the first dopant type, the second doped well being within the first doped well.

Example 17 includes the subject matter of any one of Examples 10-16, wherein all of the metal features on the plurality of stacked interconnect layers are each electrically coupled to at least one of the one or more conductive vias.

Example 18 includes the subject matter of any one of Examples 10-17, further comprising a printed circuit board, wherein the chip package is attached to the printed circuit board.

Example 19 is a method of forming an integrated circuit. The method includes forming a plurality of semiconductor devices on a first substrate; forming an interconnect region above the first plurality of semiconductor devices, the interconnect region comprising a plurality of stacked interconnect layers; forming one or more conductive vias through one or more layers of the interconnect region, the one or more conductive vias being in contact with one or more metal features in the interconnect region; forming one or more doped junctions in a second substrate; forming one or more conductive pads on corresponding ones of the one or more doped junctions; and bonding the second substrate onto the interconnect region such that the one or more conductive pads are in contact with corresponding ones of the one or more conductive vias.

Example 20 includes the subject matter of Example 19, further comprising forming a dielectric layer on a top surface of the second substrate, wherein the bonding comprises bonding the dielectric layer on the second substrate to another dielectric layer in the interconnect region.

Example 21 includes the subject matter of Example 19 or 20, further comprising removing the first substrate and forming a backside region beneath the first plurality of semiconductor devices. In some such examples, the backside region includes one or more BPR structures.

Example 22 includes the subject matter of Example 21, further comprising forming one or more chip I/O structures on the backside region.

Example 23 includes the subject matter of Example 21 or 22, further comprising forming one or more conductive structures that extend between a metal feature in the backside region and a metal feature in the interconnect region.

Example 24 includes the subject matter of any one of Examples 19-23, further comprising forming one or more doped junctions in the first substrate and removing a first portion of the first substrate thus leaving behind a second portion of the first substrate that includes the one or more doped junctions.

Example 25 includes the subject matter of Example 24, further comprising forming one or more conductive vias that extend through a portion of the second portion of the first substrate.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a plurality of semiconductor devices having source and drain regions on a semiconductor substrate, the semiconductor substrate having a first doped region beneath the plurality of semiconductor devices;

a conductive layer in the semiconductor substrate, the conductive layer being directly adjacent to and contacting the first doped region in the semiconductor substrate;

an interconnect region above the plurality of semiconductor devices, the interconnect region comprising a plurality of stacked interconnect layers;

one or more metal features in any of the plurality of stacked interconnect layers;

one or more conductive vias through one or more layers of the interconnect region and coupled to any of the one or more metal features; and a carrier substrate having a semiconductor material with one or more second doped regions and one or more conductive pads in physical contact with corresponding ones of the one or more second doped regions, wherein the carrier substrate is bonded to the interconnect region such that the one or more conductive pads are in contact with corresponding ones of the one or more conductive vias.

2. The integrated circuit of claim 1, further comprising a backside region beneath the semiconductor substrate, wherein the backside region comprises one or more additional metal features.

3. The integrated circuit of claim 2, further comprising one or more conductive structures that extend between a metal feature in the backside region and the conductive layer.

4. The integrated circuit of claim 2, wherein the semiconductor substrate is directly between the plurality of semiconductor devices and the backside region.

5. The integrated circuit of claim 1, further comprising a conductive via that extends between a metal feature of the one or more metal features and the conductive layer in the semiconductor substrate.

6. The integrated circuit of claim 1, wherein all of the metal features in the plurality of stacked interconnect layers are each electrically coupled to at least one of the one or more conductive vias.

7. A die comprising the integrated circuit of claim 1.

8. An electronic device, comprising:

a chip package comprising one or more dies, at least one of the one or more dies comprising a plurality of semiconductor devices having source and drain regions on a semiconductor substrate, the semiconductor substrate having a first doped region separate from the source and drain regions;

a conductive layer in the semiconductor substrate, the conductive layer abutting the first doped region in the semiconductor substrate;

an interconnect region above the plurality of semiconductor devices, the interconnect region comprising a plurality of stacked interconnect layers;

one or more metal features in any of the plurality of stacked interconnect layers;

one or more conductive vias through one or more layers of the interconnect region and coupled to any of the one or more metal features; and a carrier substrate having a semiconductor material with one or more second doped regions and one or more conductive pads in physical contact with corresponding ones of the one or more second doped regions, wherein the carrier substrate is bonded to the interconnect region such that the one or more conductive pads are in contact with corresponding ones of the one or more conductive vias.

9. The electronic device of claim 8, wherein the at least one of the one or more dies further comprises a backside region beneath the semiconductor substrate, wherein the backside region comprises one or more additional metal features.

10. The electronic device of claim 9, wherein the at least one of the one or more dies further comprises one or more conductive structures that extend between a metal feature in the backside region and the conductive layer.

11. The electronic device of claim 9, wherein the semiconductor substrate is directly between the plurality of semiconductor devices and the backside region.

12. The electronic device of claim 8, wherein the at least one of the one or more dies further comprises a conductive via that extends between a metal feature of the one or more metal features and the conductive layer in the semiconductor substrate.

13. The electronic device of claim 8, wherein all of the metal features in the plurality of stacked interconnect layers are each electrically coupled to at least one of the one or more conductive vias.

14. The electronic device of claim 8, further comprising a printed circuit board, wherein the chip package is attached to the printed circuit board.

15. An integrated circuit comprising:

a plurality of semiconductor devices on a first substrate, the first substrate having a semiconductor material with one or more first doped regions beneath the plurality of semiconductor devices;

one or more conductive layers in the first substrate and physically contacting corresponding ones of the one or more first doped regions;

an interconnect region above the plurality of semiconductor devices, the interconnect region comprising a plurality of stacked interconnect layers;

one or more metal features in any of the plurality of stacked interconnect layers;

one or more conductive structures that extend between the one or more conductive layers and one or more of the metal features in the interconnect region;

one or more conductive vias through one or more layers of the interconnect region and coupled to any of the one or more metal features; and a second substrate having a semiconductor material with one or more second doped junctions and one or more conductive pads in physical contact with corresponding ones of the one or more second doped junctions, wherein the second substrate is bonded to the interconnect region such that the one or more conductive pads are in contact with corresponding ones of the one or more conductive vias.

16. The integrated circuit of claim 15, further comprising a backside region beneath the first substrate and including one or more additional metal features.

17. The integrated circuit of claim 15, wherein the one or more conductive structures that extend between the one or more conductive layers and the one or more of the metal features in the interconnect region are adjacent to corresponding one or more of the plurality of semiconductor devices.

18. The integrated circuit of claim 15, wherein at least one of the one or more first doped regions comprises a first doped well of a first dopant type and a second doped well of a second dopant type that is opposite to that first dopant type, the second doped well being within the first doped well.

19. The integrated circuit of claim 16, further comprising one or more conductive structures that extend through a portion of the first substrate between the one or more conductive layers and corresponding metal features of the one or more additional metal features.

20. A die comprising the integrated circuit of claim 15.

* * * * *